(12) United States Patent
Sagisaka et al.

(10) Patent No.: US 10,011,684 B2
(45) Date of Patent: Jul. 3, 2018

(54) ARYLAMINE POLYMER, METHOD FOR PRODUCING THE SAME, INK COMPOSITION, FILM, ELECTRONIC DEVICE, ORGANIC THIN-FILM TRANSISTOR, AND DISPLAY DEVICE

(71) Applicant: Ricoh Company, Ltd., Tokyo (JP)

(72) Inventors: Toshiya Sagisaka, Yokohama (JP); Takashi Okada, Yokohama (JP); Masaomi Sasaki, Susono (JP); Masafumi Torii, Yokohama (JP); Takuji Kato, Fukuoka (JP); Tamotsu Aruga, Atsugi (JP); Satoshi Yamamoto, Yokohama (JP); Daisuke Goto, Yokohama (JP); Shinji Matsumoto, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 29 days.

(21) Appl. No.: 14/747,312

(22) Filed: Jun. 23, 2015

(65) Prior Publication Data

US 2015/0284511 A1    Oct. 8, 2015

Related U.S. Application Data

(62) Division of application No. 12/671,290, filed as application No. PCT/JP2008/066895 on Sep. 11, 2008, now abandoned.

(30) Foreign Application Priority Data

Sep. 13, 2007  (JP) .................................. 2007-238169
Nov. 29, 2007  (JP) .................................. 2007-309150

(Continued)

(51) Int. Cl.
*H01L 51/30*   (2006.01)
*C08G 73/02*   (2006.01)

(Continued)

(52) U.S. Cl.
CPC ......... *C08G 73/0266* (2013.01); *C08G 61/12* (2013.01); *C08G 73/02* (2013.01);

(Continued)

(58) Field of Classification Search
None
See application file for complete search history.

(56) References Cited

U.S. PATENT DOCUMENTS 5,777,070 A     7/1998  Inbasekaran et al.
5,821,002 A *  10/1998  Ohnishi ................. C08G 61/00
                                                    252/301.16

(Continued)

FOREIGN PATENT DOCUMENTS

EP    1 277 824 A1   1/2003
JP    5 55568        3/1993

(Continued)

OTHER PUBLICATIONS

Lee et al (Sterically Hindered Fluorenyl-Substituted Poly(p-phenylenevinylenes) for Light-Emitting Diodes, Macromolecules, 2002, 35 (4), pp. 1356-1364) (Year: 2002).*

(Continued)

*Primary Examiner* — Rachel Kahn
(74) *Attorney, Agent, or Firm* — Oblon, McClelland, Maier & Neustadt, L.L.P.

(57) ABSTRACT

A polymer containing a repeating unit expressed by General Formula (I):

General Formula (I)

(Continued)

where $Ar^1$ represents a substituted or unsubstituted aromatic hydrocarbon group; $Ar^2$ and $Ar^3$ independently represent a divalent group of a substituted or unsubstituted aromatic hydrocarbon group; and $R^1$ and $R^2$ each independently represent a hydrogen atom, substituted or unsubstituted alkyl group, or substituted or unsubstituted aromatic hydrocarbon group.

4 Claims, 6 Drawing Sheets

(30) Foreign Application Priority Data

Jul. 18, 2008 (JP) .................... 2008-187523
Jul. 24, 2008 (JP) .................... 2008-190756

(51) Int. Cl.

| | | |
|---|---|---|
| C08G 61/12 | (2006.01) | |
| C09D 11/102 | (2014.01) | |
| C09D 179/02 | (2006.01) | |
| H01L 51/00 | (2006.01) | |
| C09K 11/06 | (2006.01) | |
| H05B 33/10 | (2006.01) | |
| H05B 33/14 | (2006.01) | |
| H01L 51/05 | (2006.01) | |

(52) U.S. Cl.
CPC .......... *C08G 73/026* (2013.01); *C09D 11/102* (2013.01); *C09D 179/02* (2013.01); *C09K 11/06* (2013.01); *H01L 51/0035* (2013.01); *H05B 33/10* (2013.01); *H05B 33/14* (2013.01); *C08G 2261/3162* (2013.01); *C08G 2261/3422* (2013.01); *C08G 2261/90* (2013.01); *C09K 2211/1416* (2013.01); *C09K 2211/1425* (2013.01); *C09K 2211/1433* (2013.01); *C09K 2211/1458* (2013.01); *H01L 51/0541* (2013.01); *H01L 51/0545* (2013.01)

(56) References Cited

U.S. PATENT DOCUMENTS

| | | | | |
|---|---|---|---|---|
| 5,879,821 | A | * | 3/1999 | Hsieh ............... C08G 61/02 313/504 |
| 6,905,785 | B2 | | 6/2005 | Noguchi et al. |
| 7,166,689 | B2 | | 1/2007 | Sagisaka et al. |
| 7,550,554 | B2 | | 6/2009 | Sagisaka et al. |
| 2003/0068527 | A1 | | 4/2003 | Noguchi et al. |
| 2004/0082813 | A1 | | 4/2004 | Iwakuma et al. |
| 2004/0212042 | A1 | | 10/2004 | Sagisaka et al. |
| 2006/0030736 | A1 | | 2/2006 | Iwakuma et al. |
| 2007/0092760 | A1 | | 4/2007 | Sagisaka et al. |
| 2007/0249861 | A1 | | 10/2007 | Iwakuma et al. |
| 2007/0249866 | A1 | | 10/2007 | Iwakuma et al. |
| 2009/0206329 | A1 | | 8/2009 | Yamaga et al. |

FOREIGN PATENT DOCUMENTS

| | | | |
|---|---|---|---|
| JP | 8 157575 | | 6/1996 |
| JP | 10 310635 | | 11/1998 |
| JP | 2002 515078 | | 5/2002 |
| JP | 2002 338665 | | 11/2002 |
| JP | 2003 147347 | | 5/2003 |
| JP | 3482719 | | 1/2004 |
| JP | 2005 101493 | | 4/2005 |
| JP | 2005 240001 | | 9/2005 |
| JP | 3780619 | | 5/2006 |
| JP | 2006 237225 | | 9/2006 |
| JP | 2006 261507 | | 9/2006 |
| JP | 2006251555 | A | 9/2006 |
| JP | 2008 133264 | | 6/2008 |
| KR | 2003-0009175 | A | 1/2003 |
| TW | 588105 | | 5/2004 |
| WO | 02 076922 | | 10/2002 |

OTHER PUBLICATIONS

Rost, H. et al., "Novel light emitting and photoconducting polyarylenevinylene derivatives containing phenylene arylamine and phenylene oxide units in the main chain", Synthetic Metals, Elsevier, vol. 84, pp. 269-270, (1997).

Bao, Zhenan et al., "Soluble and processable regioregular poly(3-hexylthiophene) for thin film field-effect transistor applications with high mobility", Appl. Phys. Lett., vol. 69, No. 26, pp. 4108-4110, (Dec. 23, 1996).

Sirringhaus, H. et al., "High-Resolution Inkjet Printing of All-Polymer Transistor Circuits", Science, vol. 290, pp. 2123-2126, (Dec. 15, 2000).

Korean Office Action dated Aug. 9, 2011, in Patent Application No. 10-2010-7002163 (with English-language translation).

Chinese Office Action dated Nov. 23, 2011 in patent application No. 200880102194.9 with English translation.

Lee et al (Sterically Hindered Fluorenyl-Substituted Poly(p-phenylenevinylenes for Light-Emitting Diodes, Macromolecules, 2002, 35, 1356-1364).

* cited by examiner

ARYLAMINE POLYMER, METHOD FOR PRODUCING THE SAME, INK COMPOSITION, FILM, ELECTRONIC DEVICE, ORGANIC THIN-FILM TRANSISTOR, AND DISPLAY DEVICE

TECHNICAL FIELD

The present invention relates to a novel arylamine polymer, method for producing the polymer, ink composition, film, electronic device, organic thin-film transistor and display device.

The novel arylamine polymer is a highly useful organic electronic material.

The present invention also relates to a pi-conjugated polymer that may be a variously useful organic electronic material for photoelectric conversion elements, thin-film transistor elements, light-emitting elements and the like.

BACKGROUND ART

There have been proposed a wide variety of function elements such as photoelectric conversion elements, thin-film transistor elements, light-emitting elements and the like, which utilize light-emitting properties or charge transport properties of organic materials. The organic materials of these elements are anticipated to bring about greatest advantages of organic materials such as lightweight, cheapness, lower production cost, flexibility, etc.

Of these function elements, various low molecular-mass materials or polymer materials have been proposed or reported for photoelectric conversion elements, particularly hole-transport materials of solar cells or electrophotographic photoconductors; typically, the former has been demanded for higher efficiency and the latter has been demanded for high-speed printing and durability.

As for materials of light-emitting elements, a wide variety of low molecular-mass or polymer materials have been reported. It is reported in the low molecular-mass materials that various laminate structures may achieve higher efficiency and suitably controlled doping processes may improve durability. However, it is also reported that, when the products are mass of low molecular-mass materials, films tend to change their conditions gradually with time; as such, there exists an essential problem in terms of film stability. On the other hand, polymer materials have been vigorously studied with respect to poly-p-phenylenevinylenes (PPVs) and polythiophenes in particular. However, these materials suffer from unsatisfactory purity and/or low fluorescence quantum yield in nature, thus high-quality light-emitting elements have not been currently achieved. In view of superior stability of polymer materials by virtue of their glassy state in nature, excellent light-emitting elements can be realized provided that polymer materials are allowed to take higher fluorescence quantum yield, thus further studies are being conducted under this concept. For example, polymer materials having a repeating unit of arylamine are the intended ones (see Patent Literatures 1 to 4 and Non-Patent Literature 1.)

In addition, the organic thin-film transistors using organic semiconductor materials have been actively studied and developed in recent years. The organic semiconductor materials can be easily formed into a thin film by an easy process such as a wet process, for example, printing, spin coating or the like. The thin-film transistors using organic semiconductor materials also have an advantage over thin-film transistors using inorganic semiconductor materials in that the temperature of the production process can be lowered.

Thus, a film can be deposited on a plastic substrate generally having a low thermal durability, so that electronic devices such as display devices can be reduced in weight and cost. Further, the electronic devices are expected to be widely used by taking advantage of flexibility of materials.

In addition, as for organic thin-film transistor elements, a wide variety of low molecular-mass or polymer materials have been reported. For example, as low molecular-mass materials, pentacene, phthalocyanine, fullerene, anthradithiophene, thiophene oligomers and bisdithienothiophene have been studied (see Patent Literature 6).

An organic thin-film transistor using pentacene as an organic semiconductor layer can have a relatively high field effect mobility. However, acene based materials have an extremely low solubility in a general solvent. Therefore, when such an acene based material is used to form a thin organic semiconductor layer of an organic thin-film transistor, a vacuum deposition process is necessary to be performed.

That is, the thin film cannot be deposited by an easy process, such as coating, printing or the like, and the acene based material does not always satisfy the expectation on the organic semiconductor material.

In addition, as polymer organic semiconductor materials, Patent Literature 2 and Patent Literature 3 respectively propose poly(3-alkylthiophen) and a copolymer of dialkylfluorene and bithiophene.

Since these polymer organic semiconductor materials have low but sufficient solubility by introducing of alkyl groups, a thin layer thereof can be formed by coating or printing without performing a vacuum deposition process.

These polymer organic semiconductor materials have high field effect mobility in a state in which molecules align. However, the alignment state of the molecules may be adversely affected by the kind of solvent and coating method during film deposition, resulting in a problem of variation of the transistor characteristics and poor quality stability.

Polymer materials such as polythiophene, polythienylenevinylene and polymers containing arylamine as a repeating unit have been also studied (Patent Literature 5).

Patent Literature 5 has been proposed by the inventors of the present invention. Although the polymer materials including the polymer materials having an arylamine unit, which are described in the related art, have remarkably enhanced their field effect mobility that is a specific property of organic electronic materials, materials having still higher field effect mobility are required in view of application to organic electronics, particularly organic FET elements.

In addition, the polymer materials are necessary to be sufficiently soluble into organic solvents in order to introduce into electronic elements greatest advantages of the organic materials, such as inexpensive production cost, sufficient flexibility and strength, lightweight, and possibility of having larger area. Pi-conjugated polymers, having a structure of stretched conjugate, typically often exhibit a rigid structure, causing lower solubility in general. The polymer materials in the related art described above are mostly difficult to be dissolved, thus various molecular designs have been tried so as to avoid the insolubility.

Patent Literature 1: U.S. Pat. No. 5,777,070
Patent Literature 2: Japanese Patent Application Laid-Open (JP-A) No. 10-310635
Patent Literature 3: JP-A No. 08-157575
Patent Literature 4: JP-A No. 2002-515078
Patent Literature 5: JP-A No. 2005-240001

Patent Literature 6: JP-A No. 5-55568
Non-Patent Literature 1: Synth. Met., 84, 269 (1997)
Non-Patent Literature 2: Appl. Phys. Lett., 69(26), 4108 (1996)
Non-Patent Literature 3: Science, 290, 2123 (2000)

DISCLOSURE OF INVENTION

The present invention has been made in light of the current problems in the related art, and aims to provide a novel pi-conjugated polymer that is a useful polymer material for an organic thin-film electroluminescent element having superior emitting properties and excellent durability, and that is a useful material for a semiconductor layer of an organic transistor.

Moreover, the present invention also aims to provide an organic thin-film transistor using a novel organic semiconductor material in order to attain high stability in quality of a transistor which is an end product produced by reliably forming a thin film by an easy process, and a display device using the organic thin-film transistor.

The inventors of the present invention have intensively studied and found that a vinylene polymer having an arylamine structure as a repeating unit can effectively solve the problems.

Means for solving the above-described problems are described below.

<1> A polymer containing a repeating unit expressed by General Formula (I):

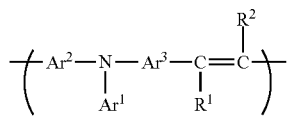

General Formula (I)

where $Ar^1$ represents a substituted or unsubstituted aromatic hydrocarbon group; $Ar^2$ and $Ar^3$ each independently represent a divalent group of a substituted or unsubstituted aromatic hydrocarbon group; and $R^1$ and $R^2$ each independently represent a hydrogen atom, substituted or unsubstituted alkyl group, or substituted or unsubstituted aromatic hydrocarbon group.

<2> A polymer containing a repeating unit expressed by General Formula (II):

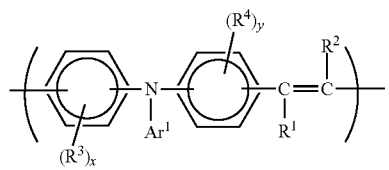

General Formula (II)

where $Ar^1$ represents a substituted or unsubstituted aromatic hydrocarbon group; $R^1$ and $R^2$ each independently represent a hydrogen atom, substituted or unsubstituted alkyl group, or substituted or unsubstituted aromatic hydrocarbon group; $R^3$ and $R^4$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x and y each independently represent an integer of 1 to 4, when x and/or y are 2 or more, a plurality of $R^3$s are independent of each other and a plurality of $R^4$s are independent of each other.

<3> A polymer containing a repeating unit expressed by General Formula (III):

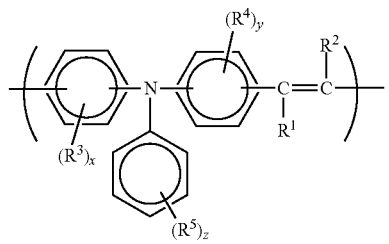

General Formula (III)

where $R^1$ and $R^2$ each independently represent a hydrogen atom, substituted or unsubstituted alkyl group, or substituted or unsubstituted aromatic hydrocarbon group; $R^3$, $R^4$ and $R^5$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x and y each independently represent an integer of 1 to 4, z represents an integer of 1 to 5, when any one of x, y and z is 2 or more, a plurality of $R^3$s are independent of each other, a plurality of $R^4$s are independent of each other and a plurality of $R^5$s are independent of each other, and each of $R^5$s is independent or at least a part of them are bound.

<4> A polymer containing a repeating unit expressed by General Formula (IV):

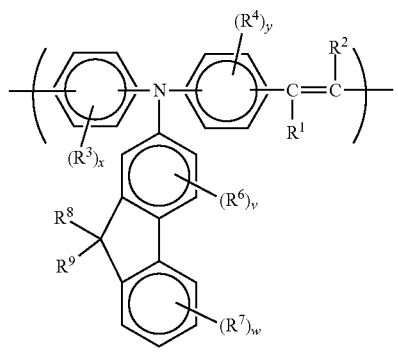

General Formula (IV)

where $R^1$ and $R^2$ each independently represent a hydrogen atom, substituted or unsubstituted alkyl group, or substituted or unsubstituted aromatic hydrocarbon group; $R^3$, $R^4$, $R^6$, $R^7$, $R^8$ and $R^9$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x, y and w each independently represent an integer of 1 to 4, v represents an integer of 1 to 3, when any one of x, y, v and w is 2 or more, a plurality of $R^3$s are independent of each other, a plurality of $R^4$s are independent of each other, a plurality of $R^6$s are independent of each other and a plurality of $R^7$s are independent of each other.

<5> The polymer according to any one of <1> to <4>, wherein the polymer is blocked with a substituent expressed by General Formula (V) at its terminal:

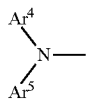

General Formula (V)

where $Ar^4$ and $Ar^5$ each independently represent a substituted or unsubstituted aromatic hydrocarbon group.

<6> An ink composition containing the polymer according to any one of <1> to <5>.

<7> A film produced by using the ink composition according to <6>.

<8> An electronic device containing the film according to <7>.

<9> A method for producing the polymer according to any one of <1> to <5>, including polymerizing an amine compound expressed by General Formula (VI) with a dihalide expressed by General Formula (VII) using a catalyst consisting of a palladium compound and a phosphine ligand under the presence of a base:

General Formula (VI)

where $Ar^1$ represents a substituted or unsubstituted aromatic hydrocarbon group;

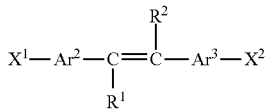

General Formula (VII)

where $Ar^2$ and $Ar^3$ each independently represent a divalent group of a substituted or unsubstituted aromatic hydrocarbon group; $R^1$ and $R^2$ each independently represent a hydrogen atom, a substituted or unsubstituted alkyl group, or a substituted or unsubstituted aromatic hydrocarbon group; and $X^1$ and $X^2$ each independently represent chlorine, bromine and iodine.

<10> An organic thin-film transistor containing an organic semiconductor layer which mainly contains a compound having a repeating unit expressed by General Formula (I) as a first component:

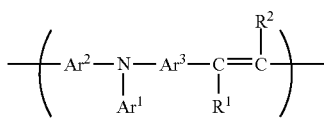

General Formula (I)

where $Ar^1$ represents a substituted or unsubstituted aromatic hydrocarbon group; $Ar^2$ and $Ar^3$ each independently represent a divalent group of a substituted or unsubstituted aromatic hydrocarbon group; and $R^1$ and $R^2$ each independently represent a hydrogen atom, substituted or unsubstituted alkyl group, or substituted or unsubstituted aromatic hydrocarbon group.

<11> The organic thin-film transistor according to <10>, wherein the organic semiconductor layer contains a compound having a repeating unit expressed by General Formula (II) as a second component:

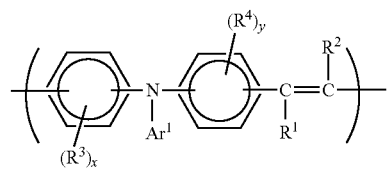

General Formula (II)

where $Ar^1$ represents a substituted or unsubstituted aromatic hydrocarbon group; $R^1$ and $R^2$ each independently represent a hydrogen atom, a substituted or unsubstituted alkyl group, or a substituted or unsubstituted aromatic hydrocarbon group; $R^3$ and $R^4$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x and y each independently represent an integer of 1 to 4, when x and/or y are 2 or more, a plurality of $R^3$s are independent of each other and a plurality of $R^4$s are independent of each other.

<12> The organic thin-film transistor according to any one of <10> to <11>, wherein the organic semiconductor layer contains a compound having a repeating unit expressed by General Formula (III) as a third component:

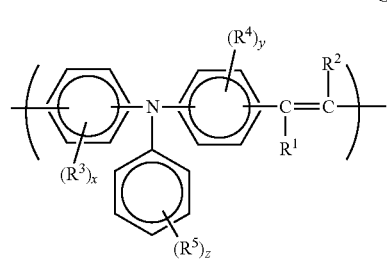

General Formula (III)

where $R^1$ and $R^2$ each independently represent a hydrogen atom, substituted or unsubstituted alkyl group, or substituted or unsubstituted aromatic hydrocarbon group; $R^3$, $R^4$ and $R^5$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x and y each independently represent an integer of 1 to 4, z represents an integer of 1 to 5, when any one of x, y and z is 2 or more, a plurality of $R^3$s are independent of each other, a plurality of $R^4$s are independent of each other and a plurality of $R^5$s are independent of each other, and each of $R^5$s is independent or at least a part of them are bound.

<13> The organic thin-film transistor according to any one of <10> to <12>, wherein the organic semiconductor layer contains a compound having a repeating unit expressed by General Formula (IV) as a fourth component:

General Formula (IV)

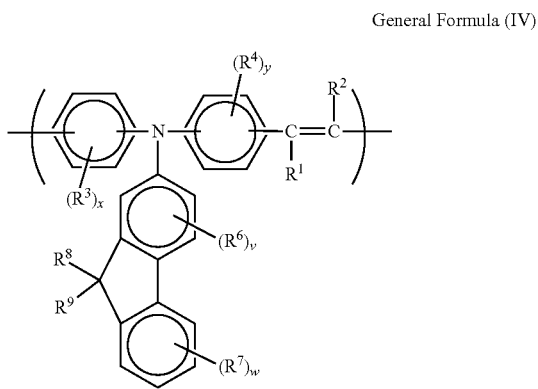

where $R^1$ and $R^2$ each independently represent a hydrogen atom, substituted or unsubstituted alkyl group, or substituted or unsubstituted aromatic hydrocarbon group; $R^3$, $R^4$, $R^6$, $R^7$, $R^8$ and $R^9$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x, y and w each independently represent an integer of 1 to 4, v represents an integer of 1 to 3, when any one of x, y, v and w is 2 or more, a plurality of $R^3$s are independent of each other, a plurality of $R^4$s are independent of each other, a plurality of $R^6$s are independent of each other and a plurality of $R^7$s are independent of each other.

<14> The organic thin-film transistor according to any one of <10> to <13>, wherein the compound having a repeating unit expressed by any one of General Formulas (I) to (IV) is blocked with a substituent expressed by General Formula (V) at its terminal:

General Formula (V)

where $Ar^4$ and $Ar^5$ each independently represent a substituted or unsubstituted aromatic hydrocarbon group.

<15> The organic thin-film transistor according to any one of <10> to <14>, wherein the organic thin-film transistor contains a pair of a first electrode and a second electrode which are separated on the organic semiconductor layer, and a third electrode having function of controlling current flowing through the organic semiconductor layer between the first electrode and the second electrode by applying voltage to the third electrode.

<16> The organic thin-film transistor according to <15>, wherein an insulating film is provided between the third electrode and the organic semiconductor layer.

<17> A display device containing a display picture element which is driven by the organic thin-film transistor according to any one of <10> to <16>.

<18> The display device according to <17>, wherein the display picture element is selected from a liquid crystal element, electroluminescent element, electrochromic element and electrophoretic element.

The present invention provides a novel arylamine polymer that is an outstandingly useful polymer material for an organic thin-film electroluminescent element having superior emitting properties and excellent durability, and that is an outstandingly useful material for a semiconductor layer of an organic transistor, and a method for producing the arylamine polymer.

According to the present invention, a polymer compound having a repeating unit expressed by any of General Formulas (I), (II), (III) and (IV), which are a material for the organic semiconductor layer, has excellent solubility in a general solvent, so that a film can be deposited using the polymer compound by wet process. Particularly, use of a high density solution increases the viscosity of the solution, allowing to deposit a thin film reliably by a printing process.

Moreover, the polymer compound is an amorphous material having no regular molecular alignment, grain sizes and grain boundaries, which do not adversely affect field effect mobility. Thus, a high quality organic semiconductor layer with significantly excellent reproducibility can be formed using the polymer compound, thereby providing an organic thin-film transistor with excellent quality stability having an organic semiconductor thin-film layer reliably formed by an easy process, and providing a display device using the organic thin-film transistor.

BEST MODE FOR CARRYING OUT THE INVENTION

Figure 1:
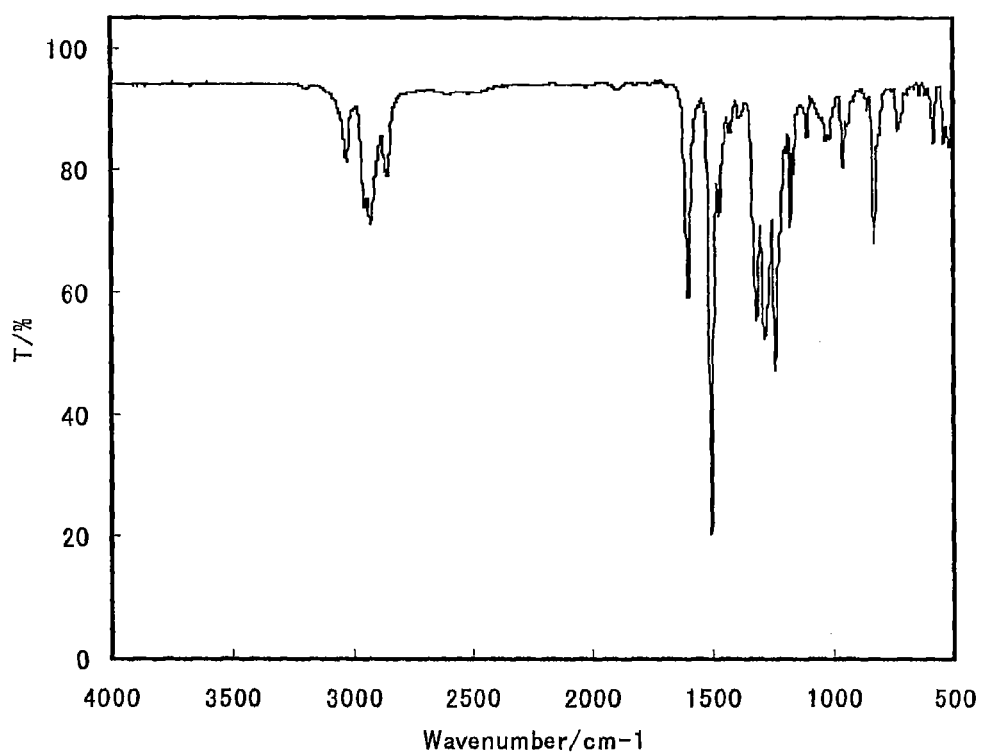
FIG. 1 shows an infrared absorption spectrum of an arylamine polymer 1 of the present invention obtained in Example 1.

At first, a method for producing an arylamine polymer of the present invention will be explained. The arylamine polymer having a repeating unit expressed by General Formula (I) of the present invention is obtained by Suzuki coupling of halide with a boronic acid compound, McMurray coupling of carbonyl compounds, or the like. However, the arylamine polymer can be easily obtained in good yield in a short time by the coupling reaction of an amine compound having a repeating unit expressed by General Formula (VI) with a dihalide having a repeating unit expressed by General Formula (VII) using a palladium catalyst under the presence of a base, as exemplified by the following reaction formula (condensation reaction accompanied by dehydrohalogenation). Thus, this method is preferably used.

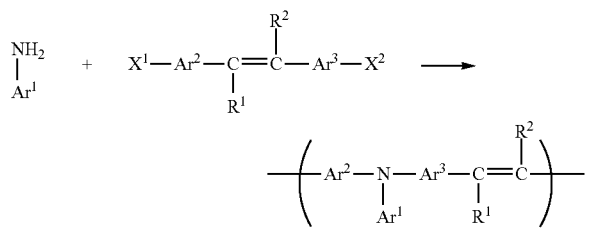

where $Ar^1$ represents a substituted or unsubstituted aromatic hydrocarbon group; $Ar^2$ and $Ar^3$ each independently represent a divalent group of a substituted or unsubstituted aromatic hydrocarbon group; $R^1$ and $R^2$ each independently represent a hydrogen atom, substituted or unsubstituted alkyl group, or substituted or unsubstituted aromatic hydrocarbon group; and $X^1$ and $X^2$ each independently represent chlorine, bromine or iodine.

Thus, a polymer can be efficiently obtained in a short time.

The dihalide expressed by General Formula (VII) can be easily formed by Wittig reaction, Wittig-Horner reaction, McMurray coupling, Suzuki coupling or the like. The dihalide is also commercially available, for example, the dihalide used in Examples is described as a product code: D3043 in a catalog of TOKYO CHEMICAL INDUSTRY CO., LTD. However, in the present invention a synthesized dihalide according to the following method is used.

Synthesis of 4,4'-dibromo-trans-stilbene

Firstly, 15.00 g (60.02 mmol) of 4-bromobenzyl bromide and 29.91 g (180 mmol) of triethyl phosphate are heated at 150° C. for 5 hours. After excess triethyl phosphate is distilled away under reduced pressure, the mixture is purified by column chromatography to obtain 17.29 g (56.30 mmol) of (4-bromobenzyl) diethyl phosphonate.

Next, 11.16 g (36.35 mmol) of the obtained (4-bromobenzyl) diethyl phosphonate and 6.372 g (36.35 mmol) of 4-bromobenzaldehyde are dissolved in DMF, and then 4.890 g (43.58 mmol) of potassium tert-butoxide is gradually added therein. After stirring for 3 hours, water is added to the reaction solution and a precipitated solid is obtained by filtration. The obtained solid is recrystallized from ethanol to obtain 9.68 g (28.64 mmol) of 4,4'-dibromo-trans-stilbene having a melting point of 214° C. to 215° C.

The molar ratio of the amount of the amine compound expressed by General Formula (VI) to the amount of the dihalide expressed by General Formula (VII) are used in equimolar amounts. However, one of them can be used in an excess amount to adjust purity of each monomer or molecular mass of a polymer to be obtained.

Examples of palladium catalysts include tetrakis(triphenylphosphine)palladium, bis(triphenylphosphine)palladium chloride, bis(benzonitrile)palladium chloride, tris(dibenzylideneacetone)dipalladium, palladium chloride and palladium acetate. It has been clear that a phosphine ligand also significantly affects the coupling reaction described above, for example, tri-(tert-butyl)phosphine, tri(orthotolyl)phosphine, BINAP, diphenyl phosphino ethane or the like can be also used. A catalytic component including a palladium catalyst and a phosphine ligand may be respectively added to a reaction system, or a palladium compound and a phosphine ligand component may be prepared beforehand, and then added to a reaction system.

The amount of the palladium catalyst is typically 0.000001 mole % to 20 mole %, and preferably 0.0001 mole % to 10 mole % relative to the amine compound expressed by General Formula (VI) in terms of a palladium equivalent.

Examples of bases used for coupling reaction include metal alkoxides, alkali metal carbonates, alkali metal phosphates, alkali metal hydroxides and alkali earth metal hydroxides. Specific examples thereof include potassium t-butoxide, sodium t-butoxide, sodium methoxide, sodium ethoxide, potassium methoxide, potassium ethoxide, potassium carbonate, sodium carbonate, cesium carbonate, potassium phosphate, sodium phosphate, potassium hydroxide and sodium hydroxide.

The amount of the base is not particularly limited, and it is preferably at least two times as many moles as that of the dihalide of a raw material.

The reaction atmosphere is preferably an inert gas atmosphere such as nitrogen gas, argon gas or the like.

A solvent used in the coupling reaction is not particularly limited as long as polymerization reaction is not inhibited. Examples thereof include aromatic hydrocarbon solvents such as benzene, toluene, xylene, mesitylene, cymene, cumene and tetrahydronaphthalene; ether solvents such as diethyl ether, tetrahydrofuran, dioxane and dimethoxyethane; dimethylformamide and acetonitrile.

The reactivity of the dihalide expressed by the above reaction formula is increased in the order of dichlorohalide, dibromohalide, and diiodohalide and the reaction temperature is adjusted according to the reactivity of the dihalide to be used.

The polymerization time of the polymerization reaction may be adjusted according to the reactivity of a monomer used, molecular mass of a desired polymer or the like. It is preferably 0.2 hours to 48 hours.

In the polymerization process, a molecular-mass controlling agent for controlling the molecular mass of resulting polymer or an end blocking agent for blocking polymer ends as an end-modifying group may be added to a reactant at the beginning of or during the reaction.

When the polymer of the present invention obtained by the coupling reaction is used as an electronic material, a polymer end is preferably terminated. As a result, there is no possibility that a halogen or proton derived from an amino group is present at a polymer chain end. Thus, change of material property over time or variation of properties among lots can be reduced.

Examples of blocking agents include monohalides and compounds having one reaction active group such as secondary amines. A monohalide having a tertiary amino group, or a secondary amine is preferably used so that the polymer has a terminal group as shown in General Formula (V). There are many polymer terminals, which may be the same or different.

General Formula (V)

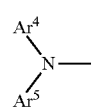

where $Ar^4$ and $Ar^5$ each independently represent a substituted or unsubstituted aromatic hydrocarbon group.

As the molecular-mass controlling agent, the same agents as the blocking agents can be used. Alternatively, a small excess amount of a secondary amine corresponding to an amine monomer material expressed by General Formula (VI) or a monohalide corresponding to a monomer material expressed by General Formula (VII) are added to a reactant as the molecular-mass controlling agent.

The repeating units (I) to (IV) of the polymer of the present invention will be specifically explained.

$Ar^1$ representing a substituted or unsubstituted aromatic hydrocarbon group in General Formula (I) may be any of a monocyclic group, a condensed polycyclic group and a non-condensed polycyclic group. Examples thereof include a phenyl group, a naphthyl group, a pyrenyl group, a fluorenyl group, an azulenyl group, an anthryl group, a triphenylenyl group, a chrysenyl group, a biphenyl group and a terphenyl group. In General Formulas, the substituted or unsubstituted aromatic hydrocarbon groups represented by $R^1$ and $R^2$ are each independently the same as the defined above description. Examples of the substituted or unsubstituted aromatic hydrocarbon groups represented by $Ar^2$ and $Ar^3$ include a divalent group of the above-described aromatic hydrocarbon group.

In addition, these aromatic hydrocarbon groups may have the following substituents:

(1) a halogen atom, a trifluoromethyl group, a cyano group or a nitro group;

(2) a straight or branched alkyl group or alkoxy group having 1 to 25 carbon atoms, which group may include a halogen atom, a cyano group, a phenyl group, a hydroxyl group, a carboxyl group, an alkoxy group and an alkylthio group as a substituent;

(3) an aryloxy group (an aryloxy group having as an aryl group, such as a phenyl group and a naphthyl group. These may contain a halogen atom as a substituent and may also contain a straight or branched alkyl group, alkoxy group or alkylthio group having 1 to 25 carbon atoms. Examples thereof include a phenoxy group, 1-naphthyloxy group, 2-naphthyloxy group, 4-methylphenoxy group, 4-methoxyphenoxy group, 4-chlorophenoxy group, and 6-methyl-2-naphthyloxy group.);

(4) an alkylthio group or alylthio group (Examples of alkylthio groups or alylthio groups include a methylthio group, ethylthio group, phenylthio group and p-methylphenylthio group.);

(5) an alkyl-substituted amino group (Examples of alkyl-substituted amino groups include a diethylamino group, N-methyl-N-phenylamino group, N,N-diphenylamino group, N,N-di(p-tolyl)amino group, dibenzylamino group, piperidino group, morpholino group and julolidyl group); and (6) an acyl group (Examples of acyl groups include an acetyl group, propionyl group, butyryl group, malonyl group and benzoyl group.).

Moreover, $Ar^4$ and $Ar^5$ in General Formula (V) are each independently the same as the definition of $Ar^1$. However, a polymer chain has two terminal groups and each terminal may be different within the scope of above description.

The arylamine polymers expressed by General Formulas (I) to (IV) of the present invention can have a halogen atom, a substituted or unsubstituted alkyl group, a substituted or unsubstituted alkoxy group or a substituted or unsubstituted alkylthio group on their aromatic rings as a substituent. In terms of improvement of the solubility of the arylamine polymer in a solvent, the arylamine polymer preferably has a substituted or unsubstituted alkyl group, a substituted or unsubstituted alkoxy group or a substituted or unsubstituted alkylthio group. Examples of such suitable substituents include alkyl groups, alkoxy groups or alkylthio groups having 1 to 25 carbon atoms. The same or different substituents may be independently introduced. In addition, the alkyl groups, alkoxy groups and alkylthio groups may further contain a halogen atom, cyano group, aryl group, hydroxyl group, carboxyl group, or aryl group which is substituted with straight, branched or cyclic alkyl group, alkoxy group or alkylthio group having 1 to 12 carbon atoms.

Specific examples of alkyl groups include a methyl group, ethyl group, n-propyl group, i-propyl group, t-butyl group, s-butyl group, n-butyl group, i-butyl group, pentyl group, hexyl group, heptyl group, octyl group, nonyl group, decyl group, 3,7-dimethyloctyl group, 2-ethylhexyl group, trifluoromethyl group, 2-cyanoethyl group, benzyl group, 4-chlorobenzyl group, 4-methylbenzyl group, cyclopentyl group and cyclohexyl group. Specific examples of the alkoxy groups and the alkylthio groups include groups in which an oxygen atom or a sulfur atom is introduced into the binding position of the alkyl groups mentioned above, respectively.

In General Formulas, the substituted or unsubstituted alkyl groups represented by $R^1$ and $R^2$ are each independently the same as the defined above description.

The solubility of the polymer of the present invention in a solvent can be improved by the presence of an alkyl group, alkoxy group or alkylthio group. It is important to improve the solubility of the polymer of the present invention because production tolerance in the process of wet film deposition expands when a device such as an organic electroluminescent element, organic transistor element or the like is produced. More specifically, selectability of coating solvents, temperature ranges upon preparing solutions, and temperatures and pressures upon drying solvents may be expanded or broadened, thus the feasible processability may result in high possibility of obtaining a high-quality thin film having high purity and superior uniformity.

Of the polymers having a repeating unit expressed by General Formula (I), a more preferred embodiment is expressed by General Formula (II):

General Formula (II)

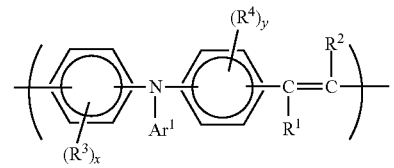

where $Ar^1$ represents a substituted or unsubstituted aromatic hydrocarbon group; $R^1$ and $R^2$ each independently represent a hydrogen atom, substituted or unsubstituted alkyl group, or substituted or unsubstituted aromatic hydrocarbon group; $R^3$ and $R^4$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x and y each independently represent an integer of 1 to 4, when x and/or y are 2 or more, a plurality of $R^3$s are independent of each other and a plurality of $R^4$s are independent of each other.

Of the polymers having a repeating unit expressed by General Formula (I) of the present invention, a more preferred second embodiment is expressed by General Formula (III);

General Formula (III)

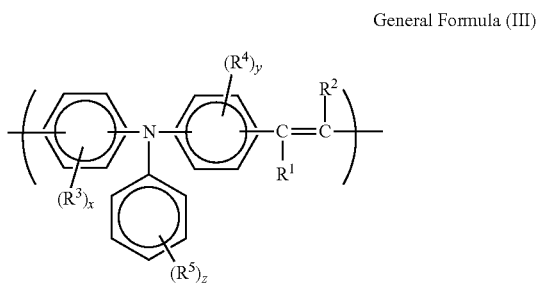

where $R^1$ and $R^2$ each independently represent a hydrogen atom, substituted or unsubstituted alkyl group, or substituted or unsubstituted aromatic hydrocarbon group; $R^3$, $R^4$ and $R^5$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x and y each independently represent an integer of 1 to 4, z represents an integer of 1 to 5, when any one of x, y and z is 2 or more, a plurality of $R^3$s are independent of each other, a plurality of $R^4$s are independent of each other and a plurality of $R^5$s are independent of each other, and each of $R^5$s is independent or at least a part of them are bound.

Of the polymers having a repeating unit expressed by General Formula (I) of the present invention, a more preferred third embodiment is expressed by General Formula (IV);

General Formula (IV)

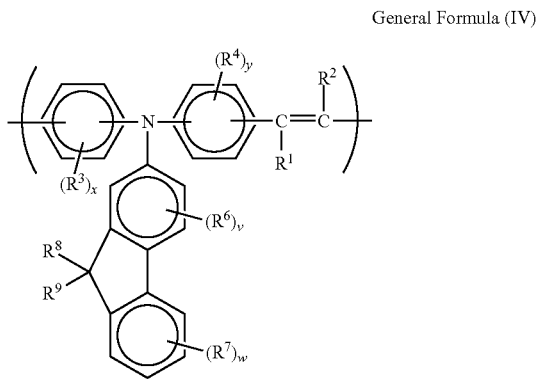

where $R^1$ and $R^2$ each independently represent a hydrogen atom, substituted or unsubstituted alkyl group, or substituted or unsubstituted aromatic hydrocarbon group; $R^3$, $R^4$, $R^6$, $R^7$, $R^8$ and $R^9$ each independently represent a hydrogen atom, halogen atom, substituted or unsubstituted alkyl group, substituted or unsubstituted alkoxy group, substituted or unsubstituted alkylthio group, or substituted or unsubstituted aromatic hydrocarbon group; and x, y and w each independently represent an integer of 1 to 4, v represents an integer of 1 to 3, when any one of x, y, v and w is 2 or more, a plurality of $R^3$s are independent of each other, a plurality of $R^4$s are independent of each other, a plurality of $R^6$s are independent of each other and a plurality of $R^7$s are independent of each other.

The polystyrene equivalent number-average molecular mass of the polymer of the present invention is preferably 1,000 to 1,000,000 and more preferably 2,000 to 500,000. A polymer having too small molecular mass (less than 1,000) may have poor film deposition ability due to occurrence of cracks, lacking in practicality. A polymer having too large molecular mass (more than 1,000,000) may have poor solubility in general organic solvents, and coating is difficult to perform due to high viscosity of the solution, thereby posing a problem for practical use.

Furthermore, it is possible to add a small amount of a branching agent during polymerization in order to improve mechanical properties. Compounds having 3 or more identical or different polymerization reaction activating groups are used as a branching agent. The branching agents can be used alone or in combination.

The arylamine polymer thus obtained is used after removal of a catalyst and base used for polymerization, unreacted monomer, blocking agent and impurity such as an inorganic salt generated during polymerization. The polymer of the present invention has excellent solubility, so that various purification methods can be selected, and purification operation is easily performed. Thus, a material with high purity can be obtained. The purification operation may be performed using a known method such as reprecipitation, extraction, Soxhlet's extraction, ultrafiltration or dialysis.

The polymer of the present invention obtained by the above production method has excellent solubility in a solvent, thereby being excellent in ink forming ability. According to various film deposition methods or a desired film thickness, a kind of solvent and other additives can be selected for an ink composition containing the polymer of the present invention, and the density, viscosity of the ink composition can be adjusted. The ink can be formed into a thin film having excellent strength, flexibility, durability, heat-resistance and luminescence free from cracks and pinholes, which cause a short-circuit in a device or decreases lifetime of a device, by means of a known film deposition method such as spin coating, casting, dipping, inkjet, doctor blade, screen printing or spray coating. Thus, the polymer of the present invention can be preferably used as a material for organic electronic devices, such as photoelectric conversion elements, thin-film transistor elements and light-emitting elements.

An embodiment of the organic thin-film transistor of the present invention will be specifically explained with reference to figures, but which is not intended to limit the present invention.

The configuration of the organic thin-film transistor of the present invention will be explained by showing schematic configurations in FIGS. 5 to 8.

An organic semiconductor layer 1 mainly contains a polymer compound having a certain repeating unit explained above and constitutes organic thin-film transistors 10, 20, 30, 40.

The organic thin-film transistor includes a first electrode (source electrode) 2 and a second electrode (drain electrode) 3 which are separated on the organic semiconductor layer 1, and a third electrode (gate electrode) 4 opposing to the first and second electrodes via the organic semiconductor layer 1.

Figure 7:
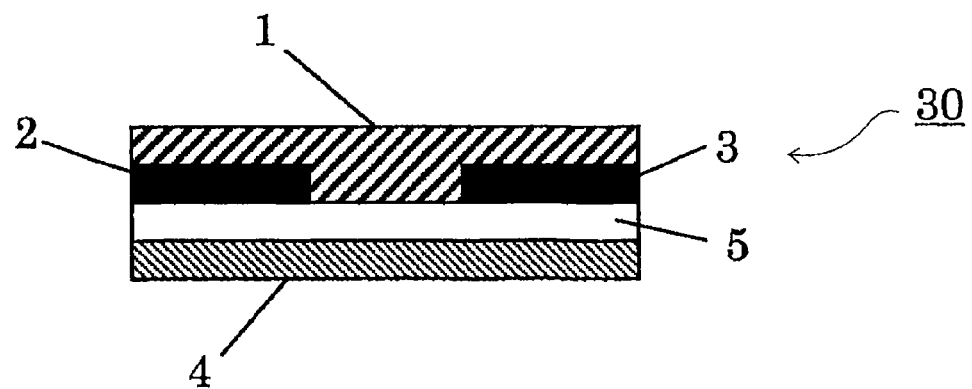
FIG. 7 shows a schematic configuration of an example of an organic thin-film transistor (third).
Figure 8:
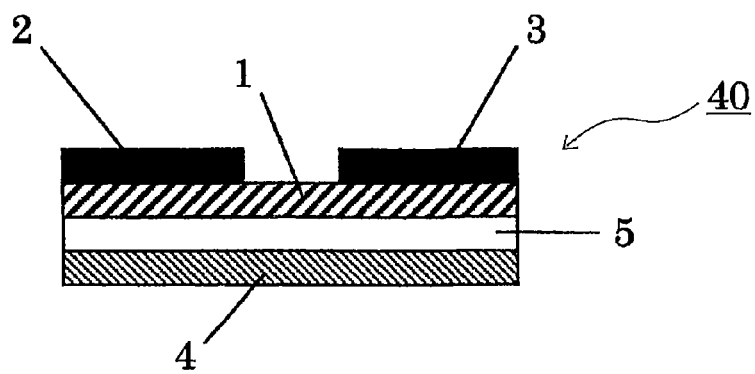
FIG. 8 shows a schematic configuration of an example of an organic thin-film transistor (fourth).

An insulating film 5 may be provided between the gate electrode 4 and the organic semiconductor layer 1 (FIGS. 7 and 8).

The organic thin-film transistors 10, 20, 30 and 40 are configured to control the current flowing through the organic semiconductor layer 1 between the source electrode 2 and the drain electrode 3 by applying voltage to the gate electrode 4.

The organic thin-film transistor of the present invention is formed on a certain substrate.

As the substrate, conventionally known substrate materials such as glass, silicon, plastic or the like may be used. A conductive substrate can be used to serve as the gate electrode 4.

The gate electrode 4 and the conductive substrate may be layered. However, when the organic thin-film transistor of the present invention is applied to a device, a plastic sheet is preferably used as the substrate so as to have excellent practical properties such as flexibility, lightweight, lower production cost and shock resistance.

Examples of the plastic sheets include films of polyethylene terephthalate, polyethylene naphthalate, polyether sulfone, polyetherimide, polyether ether ketone, polyphenylene sulfide, polyarylate, polyimide, polycarbonate, cellulose triacetate, and cellulose acetate propionate.

The organic semiconductor layer 1 constituting organic thin-film transistors 10, 20, 30, 40 of the present invention will be explained.

The organic semiconductor layer 1 mainly contains a polymer compound having a repeating unit expressed by any one of General Formulas (I), (II), (III) and (IV).

Next, a step of depositing the organic semiconductor layer 1 of the organic thin-film transistor shown in FIGS. 5 to 8 using the aforementioned polymer compound will be explained.

Firstly, a thin film may be formed by dissolving the polymer compound in a solvent such as dichloromethane, tetrahydrofuran, chloroform, toluene, dichlorobenzene or xylene, and applying it on a certain substrate.

Examples of the film deposition methods include spin coating, blade coating, dipping, casting, roll coating, bar coating, dye coating inkjet and dispensing. An appropriate method and solvent may be selected according to materials.

When the organic thin-film transistor is formed, the thickness of the organic semiconductor layer 1 is not particularly limited, but the thickness of the organic semiconductor layer 1 is so selected as to form a uniform thin film, namely, a thin film having no gaps and holes that adversely affect the carrier transportation characteristics of the organic semiconductor layer. The thickness of the organic semiconductor layer 1 is generally 1 µm or less, and particularly preferably 5 nm to 200 nm.

Next, components other than the organic semiconductor layer of the organic thin-film transistor shown in FIGS. 5 to 8 will be explained.

The organic semiconductor layer 1 is formed contacting the first electrode (source electrode) and the second electrode (drain electrode), and if necessary contacting an insulating film 5.

The insulating film 5 will be explained.

The insulating film contained in the organic thin-film transistor is formed from various materials for insulating film.

Examples thereof include inorganic insulating materials such as silicon oxide, silicon nitride, aluminum oxide, aluminum nitride and titanium oxide, tantalum oxide, tin oxide, vanadium oxide, barium-strontium-titanium oxide, barium-titanium-zirconium oxide, lead-zirconium-titanium oxide, lead lanthanum titanate, strontium titanate, barium titanate, barium magnesium fluoride, bismuth-niobium-tantalum oxide and yttrium trioxide.

Additionally, examples thereof include polymer compounds such as polyimides, polyvinyl alcohols, polyvinyl phenols, polyesters, polyethylene, polyphenylenesulfides, polystyrenes, polymethacrylic acid ester, unsubstituted or halogen atom substituted polyparaxylylene, polyacrylonitrile and cyanoethylpullulan.

These insulating materials may be used in combination. The insulating material is not particularly limited, but it is preferred to select an insulating material having a high dielectric constant and a low conductivity.

Examples of the methods of depositing the insulating film 5 include dry deposition processes such as a chemical vacuum deposition (CVD) method, a plasma CVD method and a plasma polymerization method; and wet coating processes such as spray coating, spin coating, dip coating, inkjet, casting, blade coating and bar coating.

Next, the interface modification between the organic semiconductor layer 1 and the insulating film 5 will be explained.

In the organic thin-film transistor, a certain organic thin film may be provided between the insulating film 5 and the organic semiconductor layer 1 to improve adhesiveness thereof, decrease drive voltage and reduce leak current. The organic thin film is not particularly limited as long as the organic thin film does not have a chemical effect on an organic semiconductor layer. For example, an organic molecular film and a polymer thin film can be used.

As the organic molecular film, coupling agents such as octadecyl trichlorosilane and hexamethylene disilazane can be used.

In addition, as the polymer thin film, the aforementioned polymer insulating materials can be used, and these may function as a kind of the insulating film.

This organic thin film may be subject to an anisotropic treatment by rubbing or the like.

Next, the electrodes contained in the organic thin-film transistor will be explained.

The organic thin-film transistor of the present invention contains a pair of the first electrode (source electrode) and the second electrode (drain electrode), which are separated on the organic semiconductor layer, and the third electrode (gate electrode) which has a function of controlling current flowing through the organic semiconductor layer between the first electrode and the second electrode. Because the organic thin-film transistor is a switching device, it is important that the amount of the current flowing between the first electrode (source electrode) and the second electrode (gate electrode) can be significantly modulated according to the condition of voltage applied to the third electrode (gate electrode). This means that a large current flows in the driven transistor while no current flows in the undriven state thereof.

The materials of the gate electrode and the source electrode are not particularly limited, as long as conductive materials are used. Examples thereof include platinum, gold, silver, nickel, chromium, copper, iron, tin, antimony, lead, tantalum, indium, aluminum, zinc, magnesium, and alloys thereof; conductive metal oxides such as indium/tin oxides; organic and inorganic semiconductors in which conductivity is improved by doping, etc., such as a silicon single crystal, polysilicon, amorphous silicon, germanium, graphite, polyacetylene, polyparaphenylene, polythiophene, polypyrrol, polyaniline, polythienylene vinylene, polyparaphenylene vinylene, and a complex of polyethylene dioxythiophene and polystyrene sulfonic acid.

Of the conductive materials mentioned above, materials having a low electric resistance at the surface contacting the semiconductor layer are preferred for the source electrode and drain electrode.

Examples of methods for forming an electrode include: a method in which a conductive thin film, which has been formed using the material mentioned above by deposition or sputtering, is formed into an electrode by a known method such as a photolithographic method or liftoff technology; and a method in which an electrode is formed by etching a resist on a metal foil of, for example, aluminum and copper, by thermal transfer, ink jet or the like.

In addition, an electrode may be formed by directly patterning by inkjet printing using a solution or dispersion of a conductive polymer or a dispersion of conductive particles, or may be formed from a coated layer by lithography or laser ablation.

It is also possible to use a method in which an ink, conductive paste, etc. containing conductive polymers or conductive particles are patterned by a printing method such as relief printing, intaglio printing, planographic printing or screen printing.

The organic thin-film transistor of the present invention can have an extraction electrode from each electrode if necessary.

The organic thin-film transistor of the present invention can be stably driven in the atmosphere. If necessary, a protective layer can be provided in terms of protection from mechanical destruction and moisture and/or gas, and protection for integration of a device for convenience.

The organic thin-film transistors of the present invention less vary in characteristics and have high on/off ratio (particularly, off-current is low), so that it can be utilized as an element for driving conventionally known various image display elements such as liquid crystal, electroluminescence, electrochromic and electrophoretic migration. When such elements are integrated, it is possible to manufacture a display referred to as "electronic paper".

The display device of the present invention is configured by arranging a plurality of display elements in a matrix in X direction and Y direction, wherein the display element used as a display picture element is, for example, a liquid crystal display element in a liquid crystal display device, an organic or inorganic electroluminescent display element in an electroluminescent display (EL) device, and an electrophoretic display element in an electrophoretic display device. The display element includes the organic thin-film transistor of the present invention as a switching element for applying voltage or supplying current to the display element. The display device of the present invention provides a plurality of the switching elements corresponding to the number of display elements, namely, the number of display picture elements.

The display element includes a substrate, electrode such as a transparent electrode, polarizing plate and color filter, in addition to the switching elements. These constituting members are not particularly limited and may be appropriately selected from those known according to the purpose.

When the display device forms a certain image, the switching elements, which are arbitrarily selected from the switching elements arranged in a matrix, are configured to switch on or off only when a corresponding display element is supplied with voltage or current, and switch off or on in the rest of the time. Thus, the display device can display an image with high contrast at high speed. An image or the like is displayed by conventionally known display actions in the display device. For example, in the case of the liquid crystal display element, voltage is applied to liquid crystals so as to control the molecular arrangement of the liquid crystals, thereby displaying an image or the like. Moreover, in the case of the organic or inorganic electroluminescent display element, a light emitting diode formed with an organic or inorganic film is supplied with current so as to emit light from the organic or inorganic film, thereby displaying an image or the like. Furthermore, in the case of the electrophoretic display device, voltage is applied to white or black colored particles which are respectively charged to have different polarities so that the particles electrically migrate in a certain direction between electrodes, thereby displaying an image or the like.

In the display device, the switching element can be produced by an easy process, such as coating, printing or the like. The display device can use the substrate which cannot tolerate high temperature treatment, such a plastic substrate, paper or the like, and the switching element can be produced with energy saving and at low cost in spite of a large area display.

Additionally, display picture elements are driven by the organic thin-film transistors of the present invention which less vary in characteristics and use the polymer compound, so that variation in the displays between the picture elements is decreased even in the case where the plurality of display elements are arranged in a matrix.

It is also possible to use an IC in which the organic thin-film transistors of the present invention are integrated as a device such as an IC tag.

EXAMPLES

Hereinafter, Examples of the present invention will be described, which however shall not be construed as limiting the scope of the present invention.

Example 1

(Synthesis of Polymer 1)

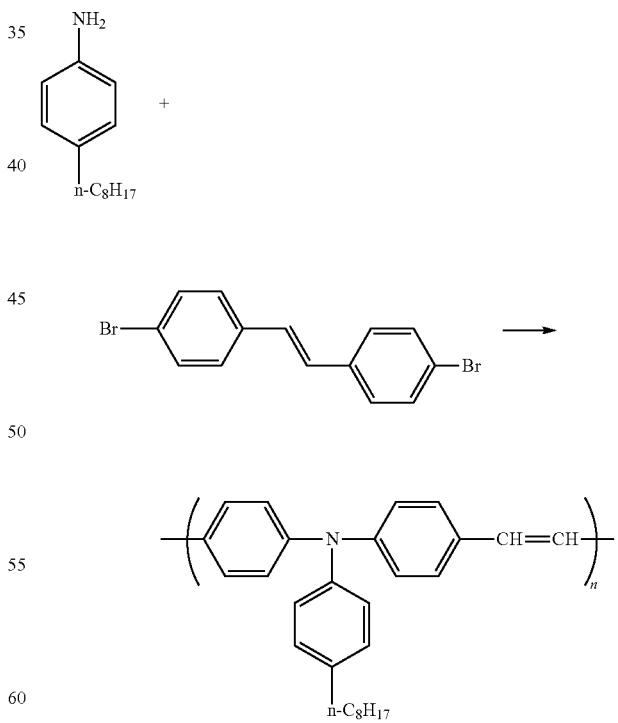

A 100-ml flask was charged with 0.911 g (4.44 mmol) of p-n-octylaniline, 1.500 g (4.44 mmol) of 4,4'-dibromo-trans-stilbene, 18.0 mg of P(tBu)$_3$, 20.3 mg of Pd$_2$(dba)$_3$, 1.705 g of sodium t-butoxide and 27 ml of toluene, and was purged with argon gas, and the solution was refluxed for 3 minutes.

To the reaction solution, 37.5 mg of diphenylamine as a blocking agent was added and refluxed for 30 minutes, and then 69.7 mg of bromobenzene was further added and further refluxed for 30 minutes. The reaction solution was allowed to cool to room temperature, diluted by toluene, and then a small amount of water was added thereto. The resultant solution was dropped to 800 ml of methanol, and then a precipitated solid was obtained by filtration. For purification, the obtained polymer was reprecipitated by toluene/acetone, and then dissolved in toluene. The resultant solution was washed with ion-exchanged water several times. The solvent was distilled away and dried under reduced pressure to obtain a polymer 1 having a diphenylamine structure at its terminal. The amount of the thus obtained polymer 1 was 1.22 g and the yield thereof was 72%.

The polymer 1 was easily dissolved in solvents such as THF, toluene, xylene, mesitylene, dichloromethane, chloroform and the like. A thin film formed from the polymer 1 by a wet process such as casting, spin coating or the like was a high quality amorphous film having no cracks or pinholes, and exhibited strong yellow-green fluorescence.

The polystyrene equivalent number-average molecular mass and mass-average molecular mass of the polymer 1, as measured by GPC, were 43,000 and 129,000, respectively.

The elemental analysis value (%) of the polymer 1 was as follows:

|   | Found value | Calculated value |
| --- | --- | --- |
| C | 88.05% | 88.14% |
| H | 8.20% | 8.19% |
| N | 3.70% | 3.67% |

The infrared absorption analysis of the polymer 1 was performed and the following results were obtained (see FIG. 1): the infrared absorption spectrum (NaCl cast film) v/cm⁻¹: 3026, 2925, 2853, 1601, 1506, 1466, 1319, 1283, 1178, 959 (trans-CH=CH—), 829, 732, 583, 539.

Example 2

(Synthesis of Polymer 2)

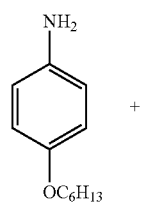

+

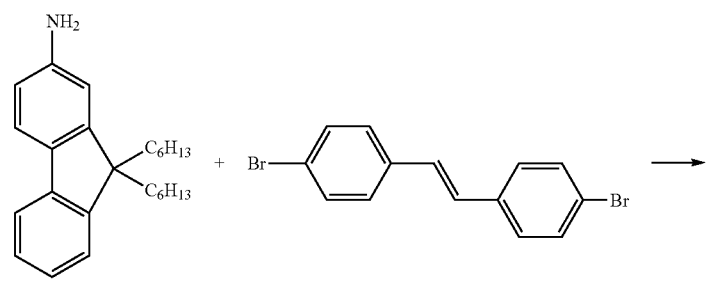

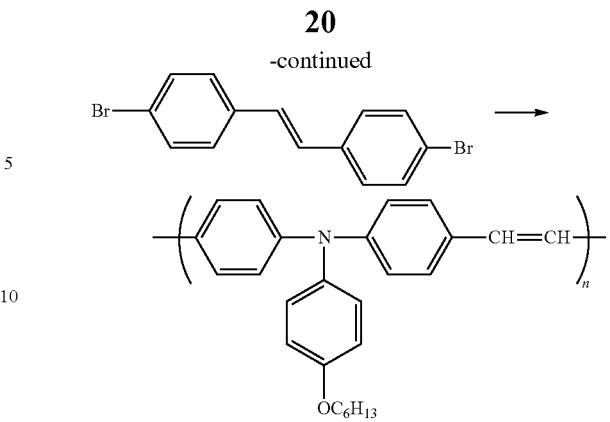

A polymer 2 having a diphenylamine structure at its terminal was synthesized in the same manner as in Example 1, except that 0.572 g (2.96 mmol) of p-n-hexyloxyaniline, and 1.000 g (2.96 mmol) of 4,4'-dibromo-trans-stilbene were used. The amount of the obtained polymer 2 was 0.75 g.

The polymer 2 was easily dissolved in solvents such as THF, toluene, xylene, dichloromethane, chloroform and the like. A thin film formed from the polymer 2 by a wet process such as casting, spin coating or the like was a high quality amorphous film having no cracks or pinholes, and exhibited strong yellow-green fluorescence.

The polystyrene equivalent number-average molecular mass and mass-average molecular mass of the polymer 2, as measured by GPC, were 27,000 and 73,000, respectively.

The elemental analysis value (%) of the polymer 2 was as follows:

|   | Found value | Calculated value |
| --- | --- | --- |
| C | 84.33% | 84.51% |
| H | 7.52% | 7.37% |
| N | 3.60% | 3.79% |

Figure 2:
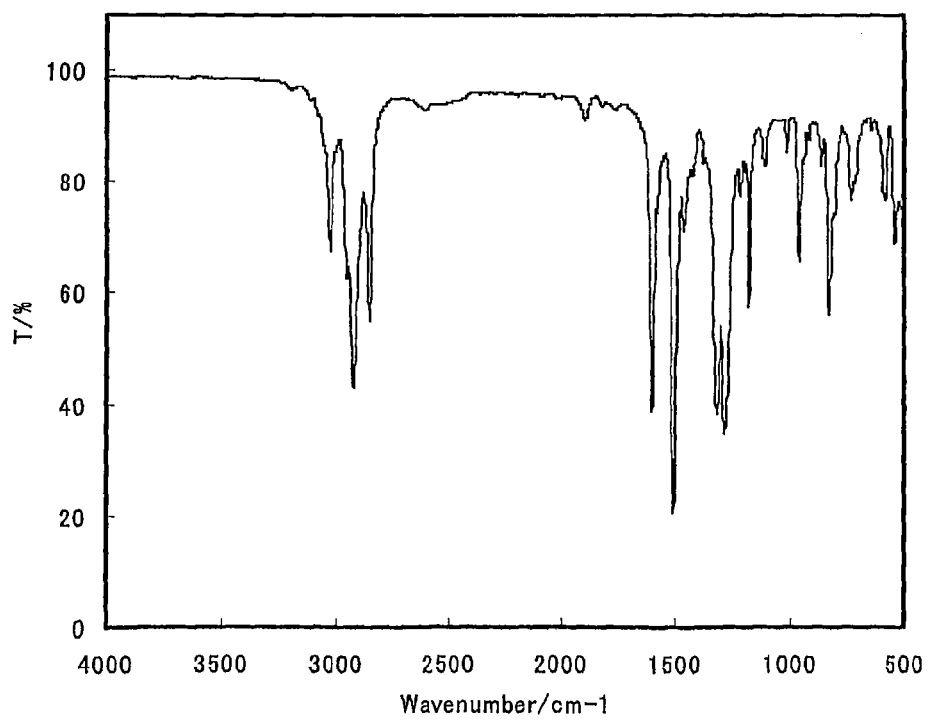
FIG. 2 shows an infrared absorption spectrum of an arylamine polymer 2 of the present invention obtained in Example 2.

The infrared absorption analysis of the polymer 2 was performed and the following results were obtained (see FIG. 2): the infrared absorption spectrum (NaCl cast film) v/cm⁻¹: 3027, 2929, 2858, 1599, 1505, 1471, 1316, 1283, 1240, 1178, 959 (trans-CH=CH—), 827, 730, 581.

Example 3

(Synthesis of Polymer 3)

-continued

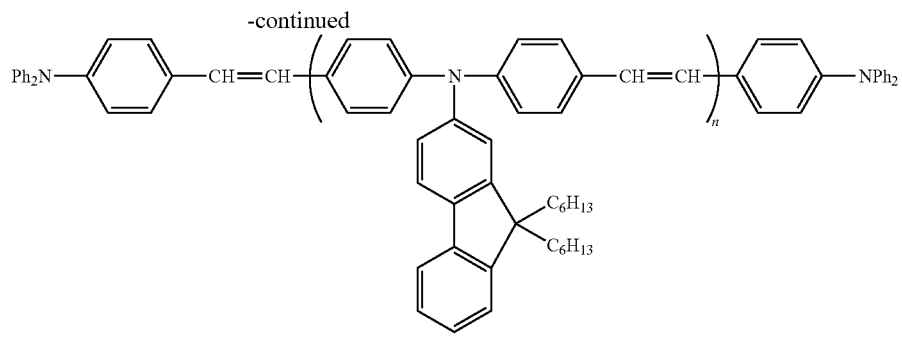

A 100-ml flask was purged with argon gas, and was charged with 12 mg of P(tBu)$_3$ and 20 ml of dried and deaerated toluene, and 13.5 mg of Pd$_2$(dba)$_3$ was further added therein and stirred for 15 minutes. In the resultant solution, 1.034 g (2.96 mmol) of 9,9-dihexyl-2-aminofluorene, 1.049 g (3.11 mmol) of 4,4'-dibromo-trans-stilbene and 1.137 g (11.83 mmol) of sodium t-butoxide were added and refluxed for 1.5 hours, and then 37.5 mg of diphenylamine were added and further refluxed for 1.5 hours. The reaction solution was allowed to cool to room temperature, and then a small amount of water was added therein. The resultant solution was dropped to 700 ml of methanol, and then a precipitated solid was obtained by filtration. For purification, the obtained polymer was reprecipitated by toluene/methanol several times, and then dissolved in toluene. The resultant solution was thoroughly washed with ion-exchanged water. The solvent was distilled away and dried under reduced pressure to obtain a polymer 3. The amount of the thus obtained polymer 3 was 1.173 g and the yield thereof was 75%.

The polymer 3 was easily dissolved in solvents such as THF, toluene, xylene, mesitylene, dichloromethane, chloroform and the like. A thin film formed from the polymer 3 by a wet process such as casting, spin coating or the like was a high quality amorphous film having no cracks or pinholes, and exhibited strong yellow-green fluorescence.

The polystyrene equivalent number-average molecular mass and mass-average molecular mass of the polymer 3, as measured by GPC, were 23,000 and 53,000, respectively.

The elemental analysis value (%) of the polymer 3 was as follows:

|   | Found value | Calculated value |
|---|---|---|
| C | 89.12% | 89.09% |
| H | 8.16% | 8.24% |
| N | 2.70% | 2.66% |

Figure 3:
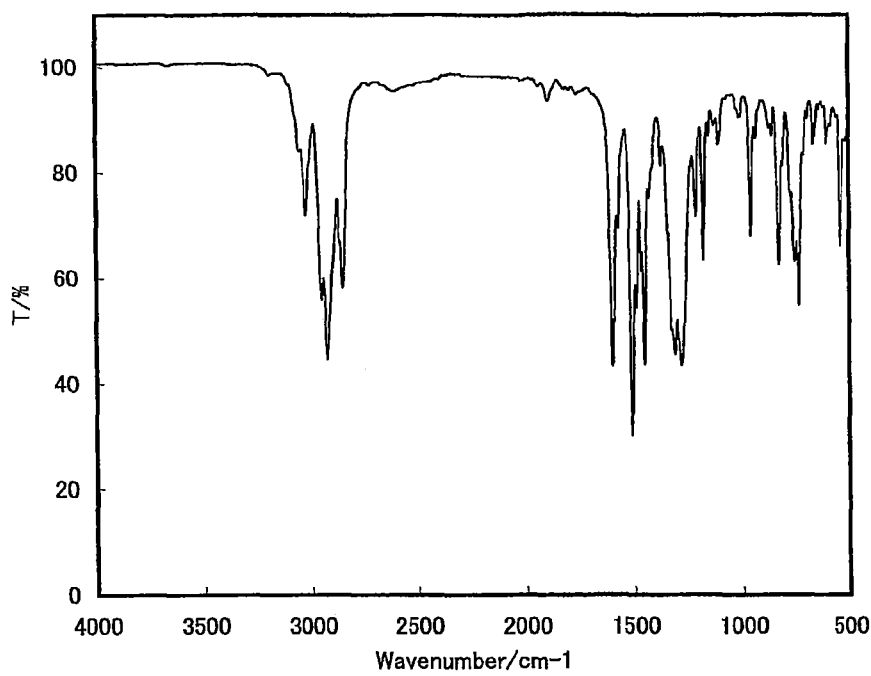
FIG. 3 shows an infrared absorption spectrum of an arylamine polymer 3 of the present invention obtained in Example 3.

The infrared absorption analysis of the polymer 3 was performed and the following results were obtained (see FIG. 3): the infrared absorption spectrum (NaCl cast film) v/cm$^{-1}$: 3027, 2954, 2927, 2855, 1602, 1508, 1452, 1309, 1282, 1215, 1177, 959 (trans-CH=CH—), 828, 757, 738, 540.

Example 4

(Production Example of Ink of Polymer 1)

An ink of the polymer 1 synthesized in Example 1 was produced. When the ink was dissolved in solvents such as THF, toluene, xylene and mesitylene, the ink exhibited a solubility of 10 mass % or more in each of the solvents. Each of the solutions containing 10 mass % of the ink had high viscosity, and separation or precipitation was not observed even a month later.

Example 5

(Example of Film Deposition from Ink of Polymer 1)

A film having a thickness of approximately 10 μm was deposited by blade coating using a 10 mass % polymer 1 in THF solution prepared in the same manner as in Example 4. A film having a thickness of approximately 40 nm was deposited by spin coating using a 1 mass % polymer 1 in toluene solution. Both films were amorphous films having no pinholes, and cracks accompanied by deformation of a substrate were not observed.

Example 6

(Production Example of Ink of Polymer 2)

An ink of the polymer 2 synthesized in Example 2 was produced. When the ink was dissolved in solvents such as THF, toluene, xylene and mesitylene, the ink exhibited a solubility of 10 mass % or more in each of the solvents except for mesitylene. Each of the solutions containing 10 mass % of the ink had high viscosity, and separation or precipitation was not observed even a month later.

Example 7

(Film Deposition Example of Ink of Polymer 2)

A film having a thickness of approximately 10 μm was deposited by blade coating using a 10 mass % polymer 2 in THF solution prepared in the same manner as in Example 6. A film having a thickness of approximately 40 nm was deposited by spin coating using a 1 mass % polymer 2 in toluene solution. Both films were amorphous films having no pinholes, and cracks accompanied by deformation of a substrate were not observed.

Example 8

(Production Example of Ink of Polymer 3)

An ink of the polymer 3 synthesized in Example 3 was produced. When the ink was dissolved in solvents such as THF, toluene, xylene and mesitylene, the ink exhibited a solubility of 10 mass % or more in each of the solvents. Each of the solutions containing 10 mass % of the ink had high viscosity, and separation or precipitation was not observed even a month later.

Example 9

(Film Deposition Example of Ink of Polymer 3)

A film having a thickness of approximately 10 μm was deposited by blade coating using a 10 mass % polymer 3 in THF solution prepared in the same manner as in Example 8. A film having a thickness of approximately 40 nm was deposited by spin coating using a 1 mass % polymer 3 in toluene solution. Both films were amorphous films having no pinholes, and cracks accompanied by deformation of a substrate were not observed.

Comparative Example 1

An ink of poly-3-hexylthiophene (expressed by the following formula) widely known as an organic semiconductor material was produced in the same manner as in Example 4. The ink exhibited a solubility of 1 mass % or less in all solvents, and only a dilute solution having low viscosity was obtained. The ink could be dissolved in the solvents by heating, but after cooled to room temperature, precipitation of a solute was observed.

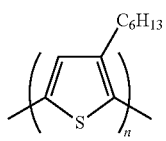

Comparative Example 2

A compound expressed by Comparative Formula 1 was synthesized by the following reaction process.

A 100-ml, three-necked flask was charged with, as shown in the above reaction formula, 1.182 g (2.03 mmol) of diboron esters, 0.659 g (2.03 mmol) of a dibromo compound, 16.4 mg (0.03 mmol) of Aliquat336 (SIGMA-ALDRICH Corp.) as a phase-transfer catalyst, 7.4 mg (0.06 mmol) of phenylboronic acid, 5.87 mg (0.0051 mmol) of tetrakis triphenylphosphine palladium and 14 ml of toluene, and was purged with nitrogen gas, and then 4.1 ml of 2M aqueous sodium carbonate solution was added therein. The reaction solution was refluxed for 14 hours, and 157 mg (1.0 mmol) of bromobenzene was added thereto, and further refluxed for 6 hours. The reaction solution was cooled to room temperature, an organic layer was dropped to a mixed solvent of methanol/water, and then a solid was obtained by filtration, thereby obtaining a compound expressed by Comparative Formula 1. The amount of the compound of Comparative Formula 1 was 1.00 g and the yield thereof was 100%. The compound of Comparative Formula 1 was not dissolved in solvents such as THF, chloroform, toluene and the like. The compound of Comparative Formula 1 could not be further purified and characteristics thereof could not be evaluated.

Application Example 1

(Production of Thin-Film Transistor)

Figure 4:
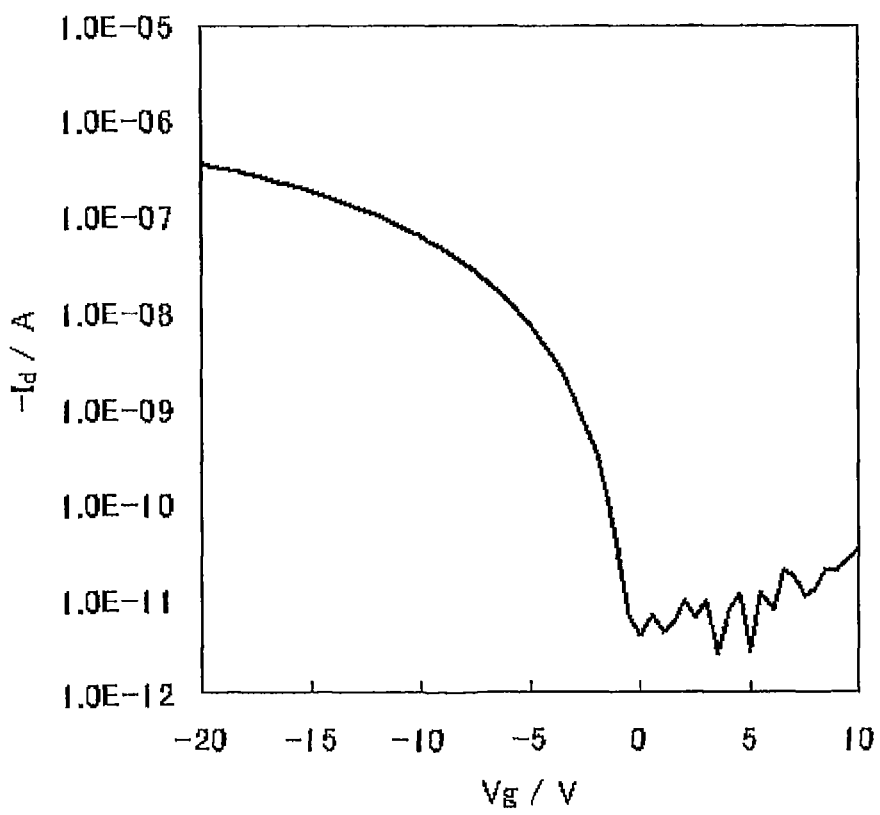
FIG. 4 shows a transistor characteristics obtained in Application Example 1.
Figure 5:
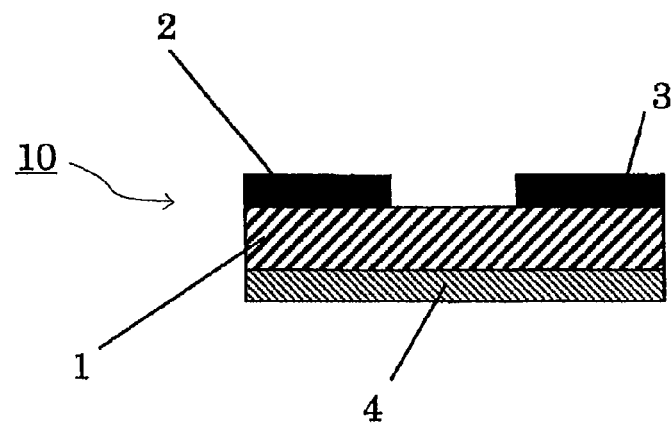
FIG. 5 shows a schematic configuration of an example of an organic thin-film transistor (first).
Figure 6:
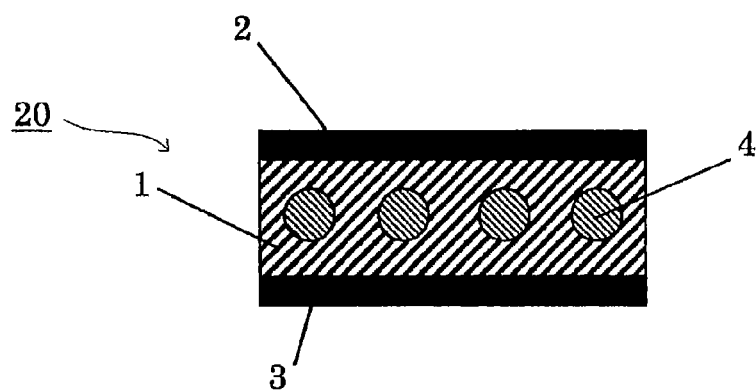
FIG. 6 shows a schematic configuration of an example of an organic thin-film transistor (second).

A surface of a p-doped silicon substrate having a 30 mm square was thermally oxidized to form an $SiO_2$ insulating film having a thickness of 200 nm, and then one side thereof was covered with a resist film (TSMR8800 manufactured by Tokyo Ohka Kogyo Co., Ltd.) and the oxidized film on the other side was removed by fluorinated acid. Next, aluminum was deposited to have a thickness of 300 nm on the side from which the oxidized film had been removed. Thereafter, the resist film was removed from the substrate by acetone, and then the substrate was heated at 140° C. for 15 minutes. The substrate was cooled to room temperature, and approximately 1.0 mass % of a tetrahydrofuran solution of the polymer 2 produced in Example 2 was spin coated on the $SiO_2$ surface of the substrate, and dried to deposit an organic semiconductor layer having a thickness of approximately 30 nm. On the organic semiconductor layer, Au was deposited so as to form a source-drain electrode having a thickness of 100 nm, a channel length of 50 μm and a channel width of 10 mm. The produced thin-film transistor was evaluated and exhibited the following excellent characteristics: field effect mobility of $7\times10^{-4}$ $cm^2/Vs$, threshold voltage of $-2.92V$, and on/off ratio of $1.4\times10^5$. FIG. 4 shows a transfer characteristic of the produced thin-film transistor with Vds=−20V.

Comparative Formula 1

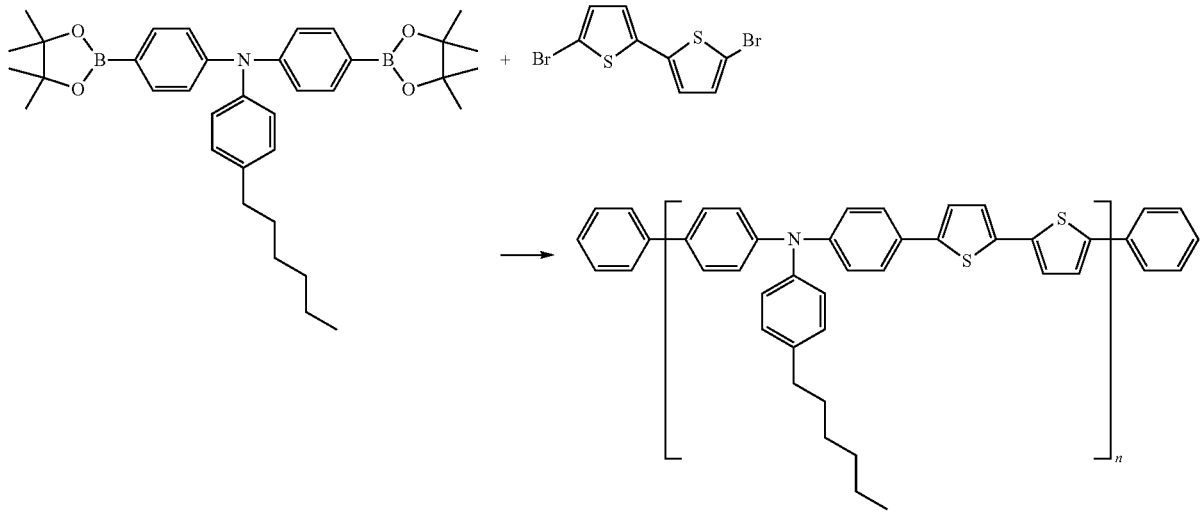

Application Example 2

An organic thin-film transistor was produced in the same manner as in Application Example 1, except that the polymer 3 synthesized in Example 3 was used.

The produced thin-film transistor was evaluated and exhibited the following excellent characteristics: field effect mobility of $3.5 \times 10^{-3}$ cm$^2$/Vs, and on/off ratio of $2 \times 10^5$.

In order to confirm reproducibility of the organic thin-film transistor characteristics, 10 organic thin-film transistors were produced and evaluated in the same manner as described above. The field effect mobility of the produced thin-film transistors were within the range of $3.3 \times 10^{-3}$ cm$^2$/Vs to $3.7 \times 10^{-3}$ cm$^2$/Vs, thereby obtaining excellent reproducibility of transistor characteristics.

Next, samples for evaluating the organic thin-film transistors having organic semiconductor layers deposited by using the polymers 1 to 3 were produced.

At first, a substrate for evaluating the organic thin-film transistor was prepared.

A surface of a p-doped silicon substrate having a 30 mm square was thermally oxidized to form an SiO$_2$ insulating film having a thickness of 200 nm, and then one side thereof was covered with a resist film (TSMR8800 manufactured by Tokyo Ohka Kogyo Co., Ltd.) and the oxidized film on the other side was removed by fluorinated acid.

Next, aluminum was deposited to have a thickness of 300 nm on the side from which the oxidized film had been removed. Thereafter, the resist film was removed from the substrate by acetone, and then the substrate was heated at 140° C. for 15 minutes.

Example 10

On the substrate for evaluating the organic thin-film transistor prepared by the above method, an organic thin-film transistor was produced by using the polymer 1 synthesized in Example 1.

The 1.0 mass % polymer 1 synthesized in Example 1 in THF solution was spin coated on the SiO$_2$ surface of the substrate and dried to deposit an organic semiconductor layer having a thickness of approximately 30 nm.

Next, on the organic semiconductor layer, Au was deposited so as to form a source-drain electrode having a thickness of 100 nm, a channel length of 50 μm and a channel width of 10 mm.

The produced organic thin-film transistor had a configuration shown in FIG. 8, and the p-doped silicon substrate as a support having the aluminum thin film under part thereof served together as a gate electrode.

The field effect mobility, which is the characteristics of the organic thin-film transistor produced as described above, was measured.

The field effect mobility of the organic thin-film transistor was calculated using the following equation.

$$Ids = \mu C_{in} W(Vg - Vth)^2 / 2L$$

where Cin is a capacitance per unit area of a gate insulating film, W is a channel width, L is a channel length, $V_g$ is a gate voltage, $I_{ds}$ is a source-drain current, μ is field effect mobility, and $V_{th}$ is a gate threshold voltage at which a channel begins to be formed.

The produced organic thin-film transistor was evaluated and exhibited the following excellent characteristics: field effect mobility of $8.9 \times 10^{-4}$ cm$^2$/Vs, threshold voltage of −2.5V, and on/off ratio of $9.3 \times 10^4$.

Figure 9:
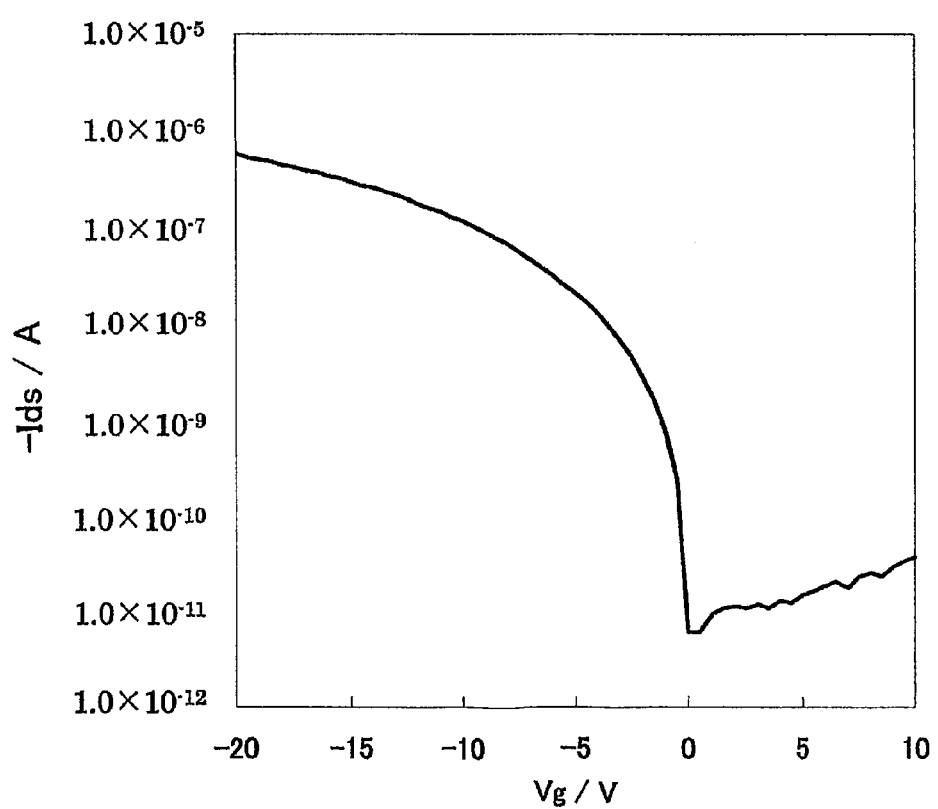
FIG. 9 shows a transfer characteristics of a transistor of Example 10.

FIG. 9 shows a transfer characteristic of the produced thin-film transistor with Vds=−20V.

In order to confirm reproducibility of the organic thin-film transistor characteristics, 10 organic thin-film transistors were produced and evaluated in the same manner as described above. The field effect mobility of the produced thin-film transistors was within the range of $8.7 \times 10^{-4}$ cm$^2$/Vs to $8.9 \times 10^{-4}$ cm$^2$/Vs, thereby obtaining excellent reproducibility of transistor characteristics.

Example 11

The substrate for evaluating the organic thin-film transistor prepared by the above method was immersed in a toluene solution of phenyltrichlorosilane so as to subject the SiO$_2$ surface of the substrate to silane coupling treatment.

An organic thin-film transistor was produced in the same manner as in Example 10, except that the above-described substrate was used.

The produced organic thin-film transistor was evaluated and exhibited the following excellent characteristics: field effect mobility of $2.4 \times 10^{-3}$ cm$^2$/Vs, threshold voltage of −2.8V, and on/off ratio of $1 \times 10^5$.

Figure 10:
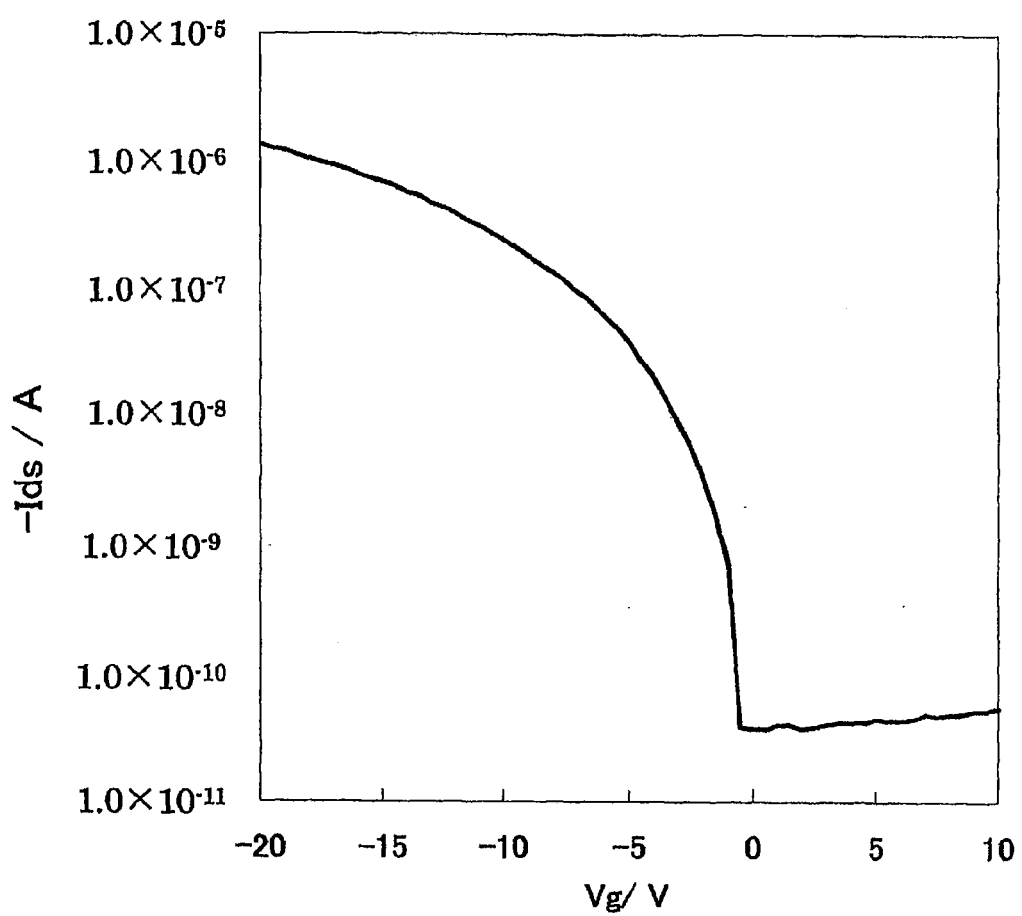
FIG. 10 shows a transfer characteristics of a transistor of Example 11.

FIG. 10 shows a transfer characteristic of the organic thin-film transistor produced in Example 11 with Vds=−20V.

In order to confirm reproducibility of the organic thin-film transistor characteristics, 10 organic thin-film transistors were produced and evaluated in the same manner as described above. The field effect mobility of the produced thin-film transistors was within the range of $2.1 \times 10^{-3}$ cm$^2$/Vs to $2.4 \times 10^{-3}$ cm$^2$/Vs, thereby obtaining excellent reproducibility of transistor characteristics.

Example 12

An organic thin-film transistor was produced in the same manner as in Example 10, except the polymer 2 synthesized in Example 2 was used.

The produced organic thin-film transistor was evaluated and exhibited the following excellent characteristics: field effect mobility of $7.0 \times 10^{-4}$ cm$^2$/Vs, threshold voltage of −2.9V, and on/off ratio of $1.4 \times 10^5$.

Figure 11:
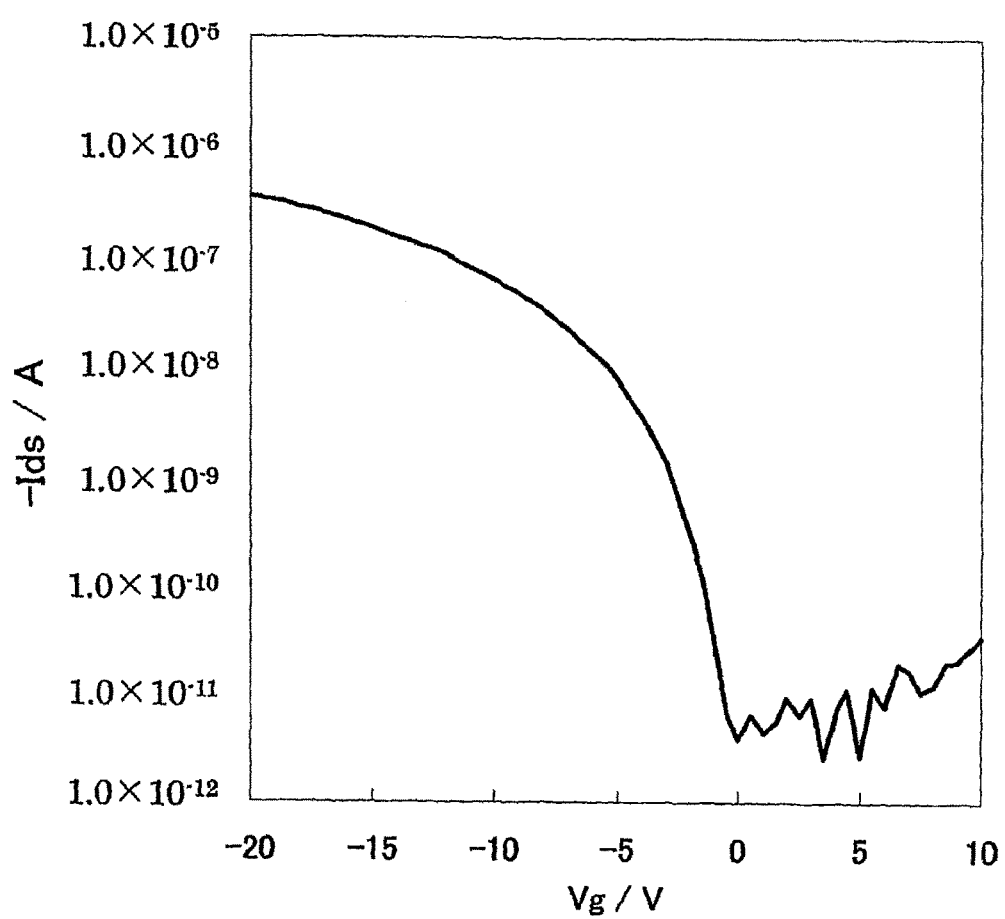
FIG. 11 shows a transfer characteristics of a transistor of Example 12.

FIG. 11 shows a transfer characteristic of the produced organic thin-film transistor with Vds=−20V.

In order to confirm reproducibility of the organic thin-film transistor characteristics, 10 organic thin-film transistors were produced and evaluated in the same manner as described above. The field effect mobility of the produced thin-film transistors was within the range of $6.8 \times 10^{-4}$ cm$^2$/Vs to $7.0 \times 10^{-4}$ cm$^2$/Vs, thereby obtaining excellent reproducibility of transistor characteristics.

Example 13

An organic thin-film transistor was produced in the same manner as in Example 10, except the polymer 3 synthesized in Example 3 was used.

The produced organic thin-film transistor was evaluated and exhibited the following excellent characteristics: field effect mobility of $3.5 \times 10^{-3}$ cm$^2$/Vs, and on/off ratio of $2 \times 10^5$.

In order to confirm reproducibility of the organic thin-film transistor characteristics, 10 organic thin-film transistors were produced and evaluated in the same manner as described above. The field effect mobility of the produced thin-film transistors was within the range of $3.3 \times 10^{-3}$ cm$^2$/

Vs to $3.7 \times 10^{-3}$ cm$^2$/Vs, thereby obtaining excellent reproducibility of transistor characteristics.

Example 14

The substrate for evaluating the organic thin-film transistor produced by the above method was immersed in a toluene solution of 4-phenylbutyltrichlorosilane so as to subject the SiO$_2$ surface of the substrate to silane coupling treatment.

The 0.5 mass % polymer 3 synthesized in Example 3 in chloroform solution was spin coated on the silane coupled SiO$_2$ surface and dried to deposit an organic semiconductor layer having a thickness of approximately 30 nm.

Next, on the organic semiconductor layer, Au was deposited so as to form a source-drain electrode having a thickness of 100 nm, a channel length of 40 μm and a channel width of 10 mm.

The produced organic thin-film transistor had a configuration shown in FIG. 8, and the p-doped silicon substrate as a support having the aluminum thin film under part thereof served together as a gate electrode.

The produced organic thin-film transistor was evaluated and exhibited the following excellent characteristics: field effect mobility of $1.0 \times 10^{-2}$ cm$^2$/Vs, and on/off ratio of $1 \times 10^5$.

In order to confirm reproducibility of the organic thin-film transistor characteristics, 10 organic thin-film transistors were produced and evaluated in the same manner as described above. The field effect mobility of the produced thin-film transistors was within the range of $9.0 \times 10^{-3}$ cm$^2$/Vs to $1.1 \times 10^{-2}$ cm$^2$/Vs, thereby obtaining excellent reproducibility of transistor characteristics.

Comparative Example 3

An organic thin-film transistor was produced in the same manner as in Example 10, except that a copolymer of 9,9-dioctylfluorene and bithiophene expressed by the following formula was used.

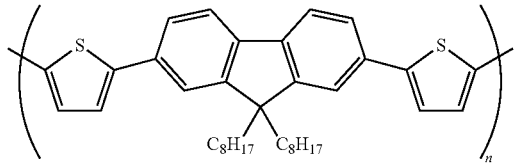

The field effect mobility of the organic thin-film transistors was $4.0 \times 10^{-4}$ cm$^2$/Vs to $2.4 \times 10^{-3}$ cm$^2$/Vs. The field effect mobility of an element was 6 times that of another element. The characteristics of the organic thin-film transistors largely vary, thus, the organic thin-film transistor had poor quality stability in terms of practical use.

Comparative Example 4

An organic thin-film transistor was produced in the same manner as in Example 10, except that 0.01 mass % poly-3-hexylthiophene in xylene solution was used.

The field effect mobility of the organic thin-film transistors was $4.0 \times 10^{-4}$ cm$^2$/Vs to $1.6 \times 10^{-3}$ cm$^2$/Vs. The field effect mobility of an element was 4 times that of another element. The characteristics of the organic thin-film transistors largely vary, thus the organic thin-film transistor had poor quality stability in terms of practical use.

As can be seen from the above results, the organic thin-film transistor produced by using the copolymer of 9,9-dioctylfluorene and bithiophene in the conventional art exhibited variation in the transistor characteristics, but the organic thin-film transistor of the present invention could be produced by an extremely easy production process and had high characteristic reproducibility, and obtained excellent quality.

According to Examples, the polymer compound expressed by General Formula (I) could deposit a film by wet process. Moreover, as the film deposited using the polymer compound was an amorphous film, the film had no regular molecular alignment, grain sizes and grain boundaries, which did not adversely affect field effect mobility, thereby obtaining excellent quality stability.

The invention claimed is:

1. A homopolymer comprising a repeating unit expressed by General Formula (IV):

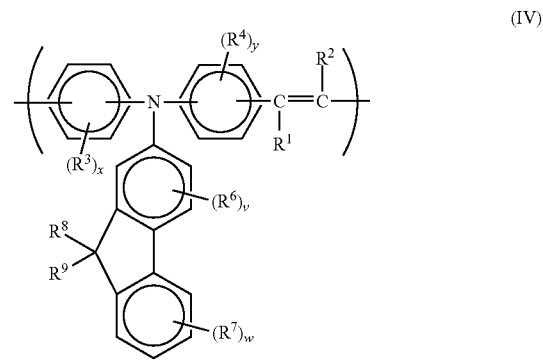

where $R^1$ and $R^2$ each represent a hydrogen atom; $R^3$, $R^4$, $R^6$, and $R^7$ each represent a hydrogen atom; $R^8$ and $R^9$ each independently represent a member selected from the group consisting of alkyl groups selected from the group consisting of methyl, ethyl, n-propyl, i-propyl, t-butyl, s-butyl, n-butyl, i-butyl, pentyl, hexyl, heptyl, octyl, nonyl, decyl, 3,7-dimethyloctyl, 2-ethylhexyl, trifluoromethyl, 2-cyanoethyl, benzyl, 4-chlorobenzyl, 4-methylbenzyl, cyclopentyl and cyclohexyl; alkylthio groups formed by insertion of sulfur into the binding position of these alkyl groups, and alkyloxy groups formed by insertion of oxygen into the binding position of these alkyl groups; and x, y and w each independently represent an integer of 1 to 4, v represents an integer of 1 to 3, wherein the homopolymer has a polystyrene equivalent number-average molecular mass of from 2,000 to 500,000.

2. The polymer according to claim 1, wherein the polymer is blocked with a substituent expressed by General Formula (V) at its terminal:

where $Ar^4$ and $Ar^5$ each independently represent a substituted or unsubstituted aromatic hydrocarbon group.

3. An electronic device comprising the homopolymer of claim 1.

4. The polymer according to claim 2, wherein $Ar^4$ and $Ar^5$ are unsubstituted or substituted phenyl.

* * * * *